(12) United States Patent
Cases et al.

(10) Patent No.: US 8,319,113 B2
(45) Date of Patent: Nov. 27, 2012

(54) PRINTED CIRCUIT BOARD WITH REDUCED DIELECTRIC LOSS

(75) Inventors: Moises Cases, Austin, TX (US);
Bradley D. Herrman, Durham, NC (US); Bhyrav M. Mutnury, Austin, TX (US); Nam H. Pham, Austin, TX (US); Terence Rodrigues, Austin, TX (US)

(73) Assignee: International Buisness Machines Corporation, Armonk, NY (US)

( * ) Notice: Subject to any disclaimer, the term of this patent is extended or adjusted under 35 U.S.C. 154(b) by 186 days.

(21) Appl. No.: 12/797,244

(22) Filed: Jun. 9, 2010

(65) Prior Publication Data

US 2011/0303445 A1  Dec. 15, 2011

(51) Int. Cl.
*H05K 1/00* (2006.01)
*H05K 3/00* (2006.01)

(52) U.S. Cl. ............ 174/258; 174/255; 174/261; 333/4; 333/246

(58) Field of Classification Search ............... 333/4, 116, 333/117, 134, 238, 246; 257/762, 760, 758; 438/422, 675, 795, 127; 29/825–854; 174/255, 174/258, 261
See application file for complete search history.

(56) References Cited

U.S. PATENT DOCUMENTS

| | | | |
|---|---|---|---|
| 6,230,401 B1 | 5/2001 | Ligander et al. | |
| 6,370,030 B1 | 4/2002 | Bergstedt et al. | |
| 6,924,712 B2* | 8/2005 | Tabatabai | 333/4 |
| 6,972,647 B1* | 12/2005 | Handforth et al. | 333/238 |
| 7,043,706 B2 | 5/2006 | Brist et al. | |
| 7,202,755 B2* | 4/2007 | Tabatabai | 333/4 |
| 7,298,234 B2* | 11/2007 | Dutta | 333/246 |
| 7,361,842 B2* | 4/2008 | Brist et al. | 174/255 |
| 7,388,448 B2* | 6/2008 | Tabatabai | 333/4 |
| 7,400,214 B2 | 7/2008 | Storniolo et al. | |
| 7,561,006 B2 | 7/2009 | Dutta | |
| 7,663,064 B2* | 2/2010 | Dutta et al. | 174/261 |
| 7,755,445 B2* | 7/2010 | Dutta et al. | 333/1 |
| 7,889,031 B2* | 2/2011 | Dutta | 333/246 |
| 7,975,378 B1* | 7/2011 | Dutta | 29/830 |
| 8,049,578 B1* | 11/2011 | Albers et al. | 333/134 |
| 2006/0108145 A1 | 5/2006 | Ueno | |
| 2006/0207087 A1 | 9/2006 | Jafri et al. | |
| 2008/0315977 A1 | 12/2008 | Green et al. | |

FOREIGN PATENT DOCUMENTS

JP  0200123060 A  *  8/2001

OTHER PUBLICATIONS

Dissertation, "Compliant Wafer Level Package (CWLP) with Embedded Air-Gaps for Sea of Leads (SoL) Interconnections", by Hollie Reed et al., Issue Date: May 2001 Publisher: Georgia Institute of Technology, pp. 151-153.

Chien, et al.; The Signal Transmission Characteristics of Embedded Microstrip Transmission Lines Over a Meshed Ground Plane in Copper/Polyimide Multichip Module; IEEE Transactions on Components, Packaging, and Manufacturing Technology; Nov. 1994; pp. 578-583; vol. 17, No. 4.; IEEE.

* cited by examiner

*Primary Examiner* — Michail V Datskovskiy (74) *Attorney, Agent, or Firm* — H. Barrett Spraggins; Cynthia G. Seal; Biggers & Ohanian, LLP (57) ABSTRACT

A printed circuit board ('PCB') with reduced dielectric loss, including conductive traces disposed upon layers of dielectric material, the layers of dielectric material including core layers and prepreg layers, one or more of the layers of dielectric material including pockets of air that reduce an overall relative dielectric constant of the PCB.

8 Claims, 10 Drawing Sheets

PRINTED CIRCUIT BOARD WITH REDUCED DIELECTRIC LOSS

BACKGROUND OF THE INVENTION

1. Field of the Invention

The field of the invention is data processing, or, more specifically, methods and products for a printed circuit board (PCB) with reduced dielectric loss.

2. Description of Related Art

Dielectric loss is one of the main reasons for AC signal loss in PCB channels. Electronic signaling speed is bound by the noise and loss in the communication channel. While noise can be contained by careful design, inherent electromagnetic properties of conductors such as dielectric loss reduces the energy of the transmitted signal causing distortion and difficulty in recovering the information transmitted.

Most dielectrics are imperfect conductors of AC signals; they present a form of resistance that causes signal loss. The tendency of a dielectric to cause such 'dielectric loss' is quantified by various measures, including, for example, dielectric constant, relative dielectric constant, various measures of permittivity such as 'relative static permittivity', the 'attenuation constant,' the 'loss tangent,' and so on. The least lossy dielectric is a vacuum, with a dielectric constant of 1.0. Typical relative dielectric constants, that is, 'relative' to the dielectric constant of a vacuum, for the dielectric laminate substrates used in PCBs, various combinations of woven glass and epoxy, for example, range roughly from 2-6. The most common dielectric today, FR4 typically demonstrates a relative dielectric constant of about 4.5.

A vacuum obviously is the preferred dielectric, but building PCBs with vacuum dielectric layers, is impractical. Other current approaches to the problem of dielectric loss include various methods of equalization such as transmitter side equalization, channel equalization, and receiver equalization. All these approaches, while effective, also require costly additional circuitry at the driver or receiver end. Other approaches that most high speed system designers take is to resort to a low loss material like IS-620 or Megtron 6. Low loss materials are usually 4-6 times more expensive than the standard dielectric material, FR4.

SUMMARY OF THE INVENTION

A printed circuit board ('PCB') with reduced dielectric loss, including conductive traces disposed upon layers of dielectric material, the layers of dielectric material including core layers and prepreg layers, one or more of the layers of dielectric material including pockets of air that reduce an overall relative dielectric constant of the PCB. The foregoing and other objects, features and advantages of the invention will be apparent from the following more particular descriptions of example embodiments of the invention as illustrated in the accompanying drawings wherein like reference numbers generally represent like parts of example embodiments of the invention.

DETAILED DESCRIPTION OF EXAMPLE EMBODIMENTS

Figure 1:
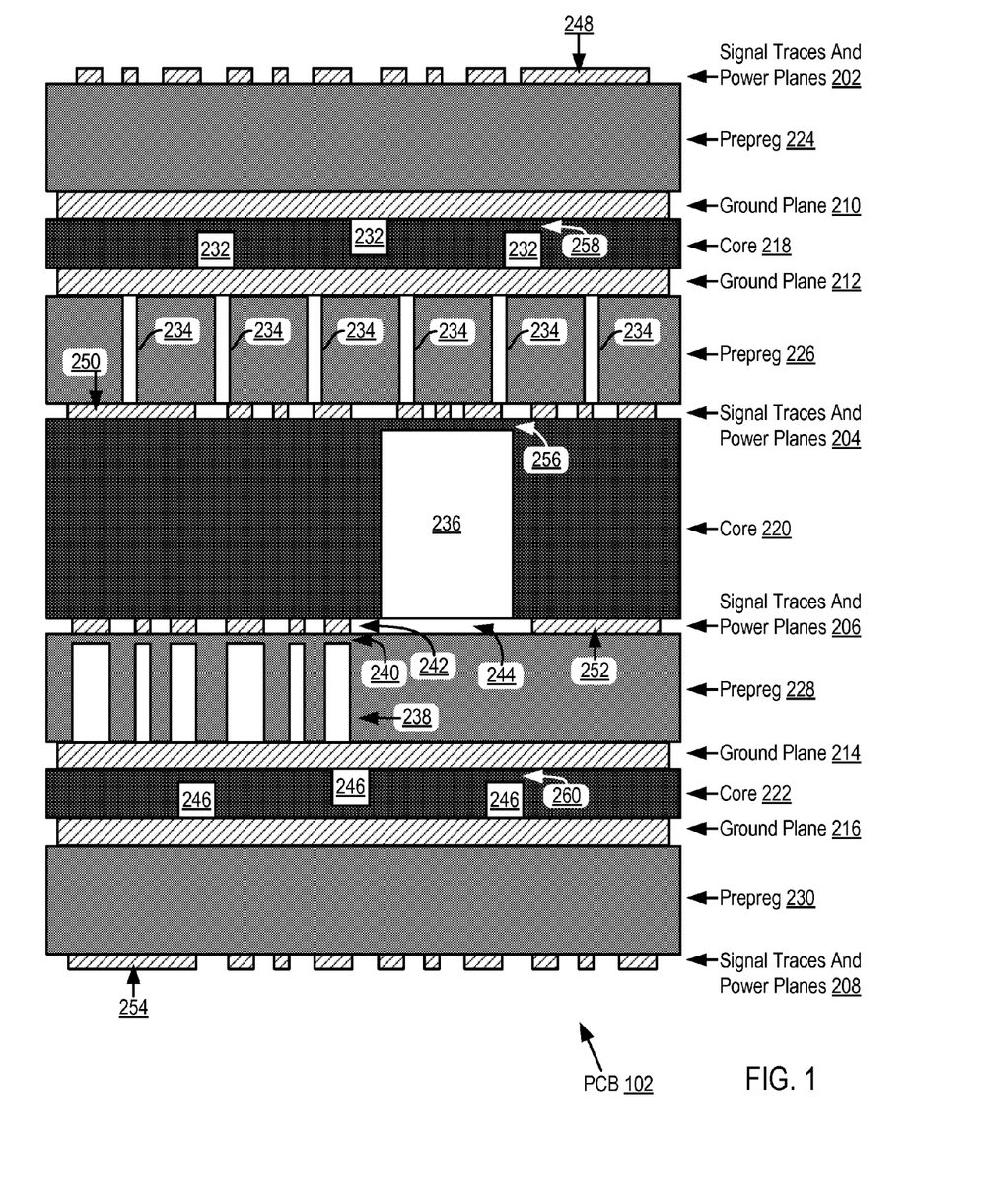
FIG. 1 sets forth a cross section view of an example PCB with reduced dielectric loss according to embodiments of the present invention.

Example structure and methods of manufacture of a printed circuit board ('PCB') with reduced dielectric loss according to embodiments of the present invention are described with reference to the accompanying drawings, beginning with FIG. 1. FIG. 1 sets forth a cross section view of an example PCB (102) with reduced dielectric loss according to embodiments of the present invention. The example PCB of FIG. 1 is a multi-layer PCB composed of layers of conductive layers and dielectric layers. The example PCB of FIG. 1 is actually an eight layer PCB, including eight conductive layers, four layers of signal traces and power planes (202, 204, 206, 208) and four ground planes (210, 212, 214, 216). Power planes provide DC voltage for powering circuits mounted on the PCB, and, in this particular example, power planes (248, 250, 252, 254) are formed on the same conductive layers with signal traces—although in other embodiments power planes may be formed on conductive layers with ground planes or even on a conductive layer dedicated entirely to a power plane. The ground planes (210, 212, 214, 216) are layers of copper that appear to signals as a ground potential, reducing noise and providing to signals from circuits mounted on the PCB the same reference potential. Ground planes also aid circuit design, allowing designers to ground anything without having to run multiple traces, simply routing a component needing grounding directly through a via to a ground plane on another layer.

The dielectric layers include three layers of core material (218, 220, 222) and four layers of prepreg material (224, 226, 228, 230). The core material is thin pieces of dielectric with copper foil bonded to both sides. The core dielectric is fiberglass-epoxy resin that is already cured when the copper foil is bonded to it. The copper foil on the core material is etched to form signal traces and power planes. The signal traces and power planes on the inner conductive layers (204, 206) are etched prior to stacking the layers of the PCB. The prepreg material is uncured fiberglass-epoxy resin. The prepreg material is cured at a later stage in manufacturing when the layers of the PCB are stacked into a 'sandwich' and cured for some time, typically two or three hours, in a heated press. After the entire PCB is thus cured in a heated press, signal traces and power planes are etched on the outer conductive layers (202, 208).

As mentioned, the preferred dielectric is the impractical alternative of a vacuum. Air, on the other hand, has a relative dielectric constant that approaches that of a vacuum, 1.00059. The PCB in the example of FIG. 1 lowers the overall relative dielectric constant of its PCB laminates by introducing pockets of air into dielectric layers of the PCB. Air pockets (232, 234, 236, 238, 246) are manufactured into five dielectric layers (218, 226, 220, 228, 222) of the PCB. The air pockets are manufactured into the dielectric layers of the PCB by known methods, drilling, numerically controlled milling, punching, etching, and so on. Some of the air pockets (234) are punched or drilled entirely through a dielectric layer (226). Other air pockets (232, 236, 238, 246) leave some dielectric material (240, 256, 258, 260) between the air pocket and conductive layers of the PCB. Air pocket (236) is drilled or milled into core layer (220) from the bottom through a region (244) having no trace material or power plane upon it. Forming an air pocket all the way through a core layer (not shown) requires a region of the core material with no traces or plane material on either side of the core layer. The air pockets (238) in prepreg layer (228) are aligned with some of the conductive traces (242). Other air pockets (234), the ones in prepreg layer (226), have no exact alignment with signal traces (204).

Ground planes provide current return paths for high speed signals, and installing air pockets (232, 246) in core material bonded to ground planes also reduces overall relative dielectric constant of the entire PCB. Internal prepreg layers (226, 228), however, have no traces bonded directly to the them, so that it is generally easy to install air pockets in such prepreg layers prior to stacking into a sandwich simply by punching, drilling, or milling holes all the way through the layer. In addition, when stacked into the sandwich of the PCB, such internal prepreg layers are stacked directly onto conductive layers bearing signal traces (204, 206). It may be, therefore, that air pockets in internal prepreg layers may be somewhat preferred to air pockets in core layers—although it is possible within the scope of the present invention to use air pockets in both core and prepreg layers.

Figure 2:
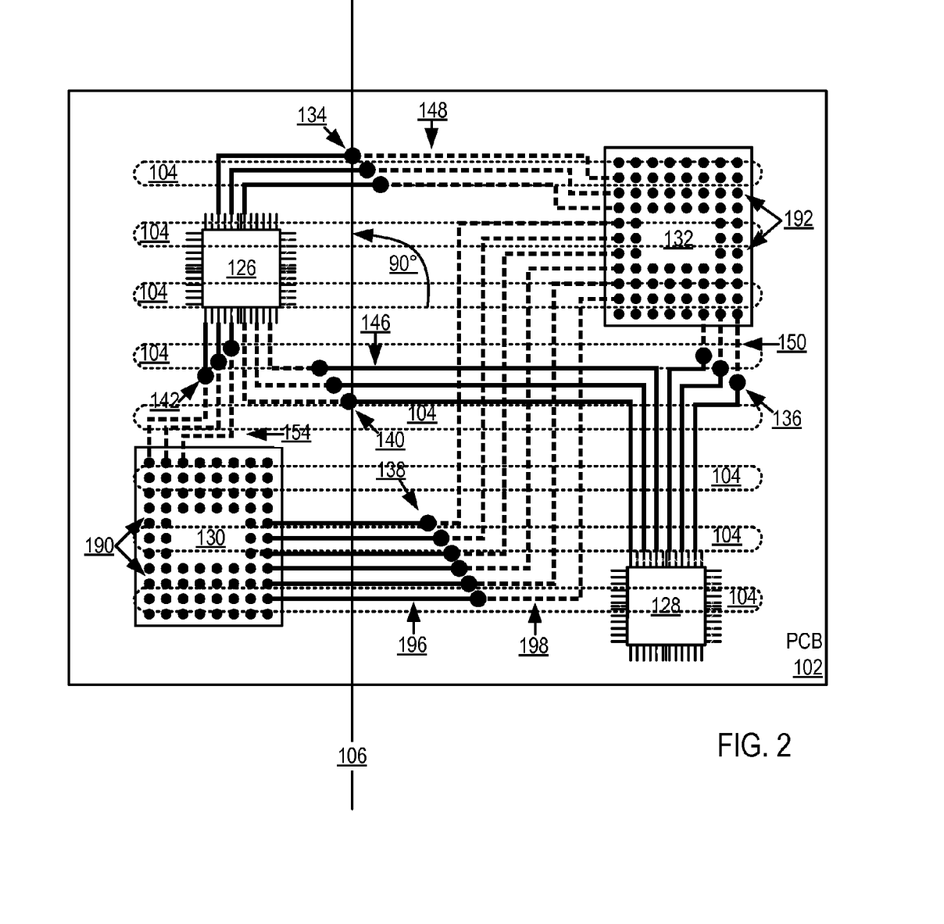
FIGS. 2-4 set forth line drawings in two-dimensional top views of example PCBs with reduced dielectric loss according to embodiments of the present invention.

For further explanation, FIG. 2 sets forth a line drawing in a two-dimensional top view of an example PCB (102) with reduced dielectric loss according to embodiments of the present invention. The example PCB (102) of FIG. 2 includes five sets of signal traces (146, 148, 150, 152, 154). PCB (102) is a multi-layer PCB, and the signal traces (146, 148, 150, 152, 154) are disposed upon various laminate layers of PCB (102). The layers are not visible in FIG. 2 because PCB (102) is illustrated in top view only. The fact that the signal traces are disposed upon various levels of PCB (102), therefore, is represented in FIG. 2 by illustrating the traces partly with solid lines (196) and partly with dotted lines (198). Transitions from dotted to solid occur at vias (134, 136, 138, 140, 142), where the traces change layers and are brought out to the top layer through the vias. PCBs like the one illustrated here would typically have ground planes and power planes also, but, for ease of explanation, PCB (102) is illustrated with signal traces only.

The PCB of FIG. 2 has mounted upon it four integrated circuits (126, 128, 130, 132) representing two kinds of integrated circuit packaging. Two of the circuits (126, 128) are packaged in Thin Quad Flat Packs or 'TQFPs,' and the other two (130, 132) are in Ball Grid Array packages or 'BGAs.' Both TQFP and BGA are forms of surface-mount technology that support many pin connections from a chip through its package to conductors on and in a PCB. It is said that pin conductors of a PCB are both 'on' and 'in' a PCB because PCBs are manufactured with multiple layers of laminate and conductors. The TQFPs (126, 128) in this example are each 52-pin packages, and each BGA (130, 132) in this example is a 76-pin package. These are conservative examples only. Surface mount packages such as these can support many more external connections. Some BGAs have hundreds of pins in their arrays. The actual connection arrays (190, 192) in this example are shown, for ease of explanation, on the top of the BGA packages (130, 132), so that they are visible to readers; readers will recognize that in an actual installation, however, the balls in a Ball Grid Array are positioned under the package, between the package and the top surface of the PCB, where they would not be visible as they are here.

The PCB of FIG. 2 also includes air pockets (104) installed in a dielectric layer below the top surface of the PCB, a fact conveyed by illustrating the air pockets (104) with dotted lines. The conductive traces (146, 148, 150, 152, 154) are disposed orthogonally, at right angles, with respect to one another on layers of dielectric. Viewed as they are, from the perspective of the top plane of the PCB, the air pockets (104) are disposed horizontally, that is, at an angle of 90 degrees with respect to any vertical axis (106) of the PCB, aligning with some of the traces and intersecting other traces at an angle of 90 degrees. Lengths of traces running in direct alignment with the air pockets experience a relative dielectric constant approaching that of a vacuum, while lengths of traces running at right angles to the air pockets experience a higher relative dielectric constant, lower than the dielectric constant of the dielectric material alone, but higher than the dielectric constant of air. Thus the traces do not receive equal treatment in terms of the experience of dielectric constant for signals on the traces. In some embodiments, this is desirable, where a set of traces known to bear demanding signals, high speed I/O lines, high speed memory buses, and the like, it may be preferred to expose such lines to the lowest possible dielectric constant, even at the expense of exposing other lines to a higher dielectric constant.

Figure 3:
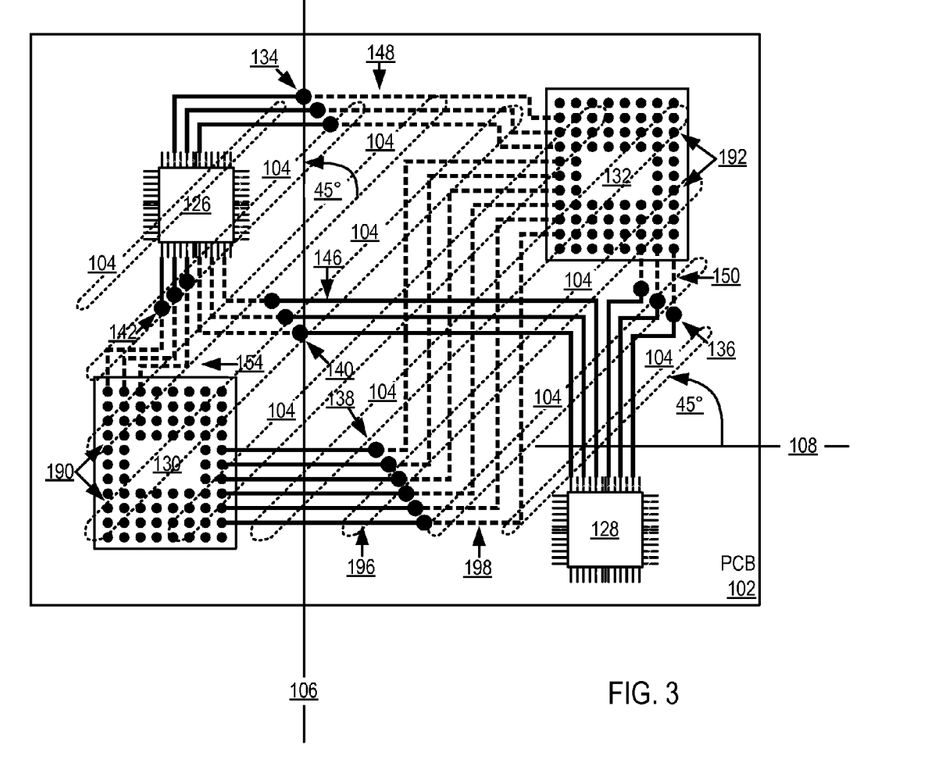

In other embodiments, where, for example, orthogonal signal traces bear similar speeds of signal traffic traveling both vertically and horizontally, it may be desirable to implement air pockets so as to reduce dielectric loss more evenly across all signal traces. For further explanation, FIG. 3 sets forth a line drawing in a two-dimensional top view of a further example PCB (102) with reduced dielectric loss according to embodiments of the present invention. The example PCB of FIG. 3 is similar to the example PCB of FIG. 2, having as it does conductive traces (146, 148, 150, 152, 154) disposed upon layers of dielectric material orthogonally with respect to one another, vias (134, 136, 138, 140, 142) that bring conductive traces out to the top layer of the PCB, and four integrated circuits (126, 128, 130, 132) mounted on the PCB. In the example of FIG. 3, however, the air pockets (104) are aligned at an angle of 45 degrees with respect to the conductive traces. That is, the air pockets are aligned at 45 degrees with respect to any vertical axis (106) of the PCB and also with respect to any horizontal axis (108). Thus the traces do receive equal treatment in terms of the experience of dielectric constant for signals on the traces, because signals on the traces experience approximately the same proportions of air and fiberglass-epoxy resin as their dielectric. If the fiberglass-epoxy resin is of the kind used in FR4, for example, and one fourth of the dielectric material in the PCB is air in air pockets, the overall relative dielectric constant of the entire PCB is reduced from approximately 4.5 to approximately 3.65. If the fiberglass-epoxy resin is of the kind used in FR4, for example, and one third of the dielectric material in the PCB is air in air pockets, the overall relative dielectric constant of the entire PCB is reduced from approximately 4.5 to approximately 3.33. If the fiberglass-epoxy resin is of the kind used in FR4, for example, and one half of the dielectric material in the PCB is air in air pockets, the overall relative dielectric constant of the entire PCB is reduced from approximately 4.5 to approximately 2.75. And so on.

Figure 4:
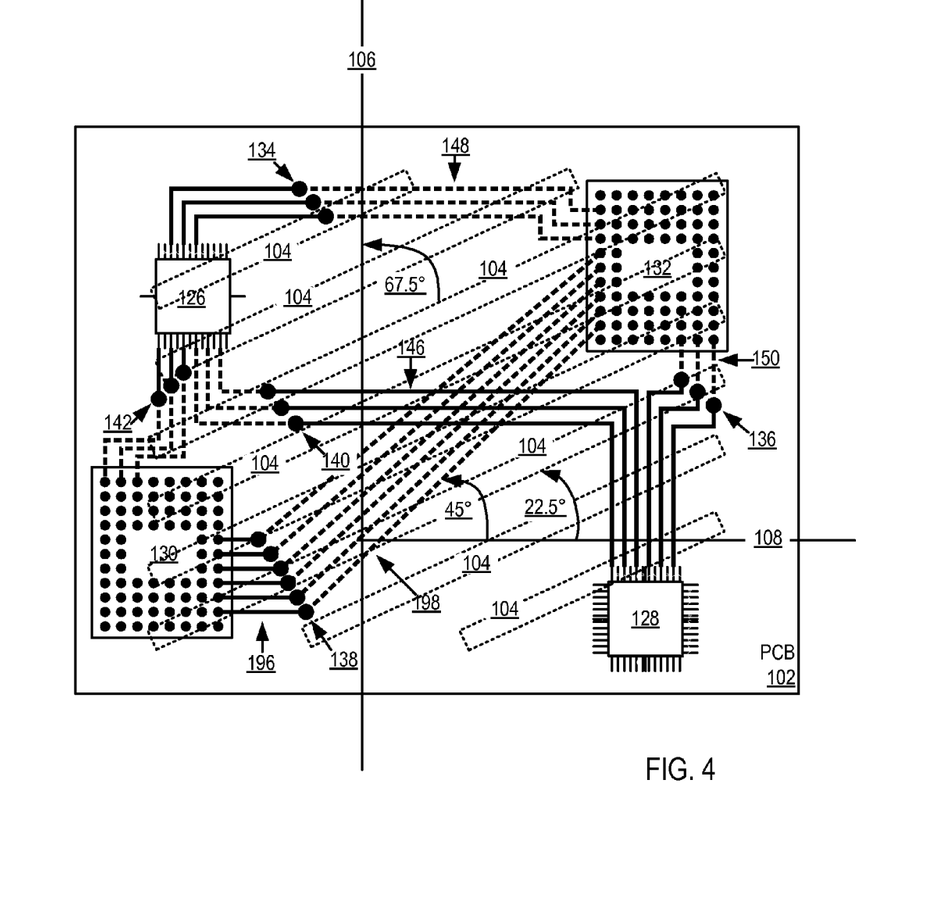

Not all traces on all PCB are oriented orthogonally with respect to one another, for further explanation of which, FIG. 4 sets forth a line drawing in a two-dimensional top view of a further example PCB (102) with reduced dielectric loss according to embodiments of the present invention. The example PCB of FIG. 4 is similar to the example PCB of FIG. 2, having as it does conductive traces (146, 148, 150, 152, 154) disposed upon layers of dielectric material orthogonally with respect to one another, vias (134, 136, 138, 140, 142) that bring conductive traces out to the top layer of the PCB, and four integrated circuits (126, 128, 130, 132) mounted on the PCB. In the example of FIG. 4, however, some of the conductive traces (146, 150) are disposed upon layers of the dielectric material orthogonally with respect to one another, and some of the conductive traces (198) are disposed upon the dielectric material at an angle of 45 degrees with respect to the orthogonal traces. If the air pockets (104) were left at 45 degrees, like the air pockets of FIG. 3, then the traces would not receive equal treatment in terms of the experience of dielectric constant for signals on the traces. Again, in some embodiments, this is desirable, where, for example, the traces (198) conduct high speed memory bus signals between a computer processor in integrated circuit (130) and a high performance memory in integrated circuit (132).

In other embodiments, it is desirable to implement air pockets so as to reduce dielectric loss more evenly across all signal traces. To this end, the air pockets (104) in the example of FIG. 4 are aligned at an angle of 22.5 degrees with respect to at least some of the orthogonal traces (148, 148). That is, the air pockets (104) are aligned at a 22.5 degree angle with respect to any horizontal axis (108) of the PCB and at a 67.5 degree angle with respect to any vertical axis (106). Thus the traces do receive equal treatment in terms of the experience of dielectric constant for signals on the traces, because signals on the traces experience approximately the same proportions of air and fiberglass-epoxy resin as their dielectric—despite the fact that some of the traces are oriented at 45 degrees. The angle of 22.5 degrees is selected in this example because it exactly splits 45 degrees, but readers of skill in the art will recognize that other angles of orientation for air pockets are feasible within the scope of the present application. An angle of 37.5 degrees, for example, represents three-fourths of 45 degrees and about 42 percent of 90 degrees—another angle that will accomplish equal treatment of traces in term of experienced dielectric constant. Other angles for accomplishing equal treatment of traces for dielectric constant will occur to those of skill in the art, and all such angles are well within the scope of the present invention.

Figure 5:
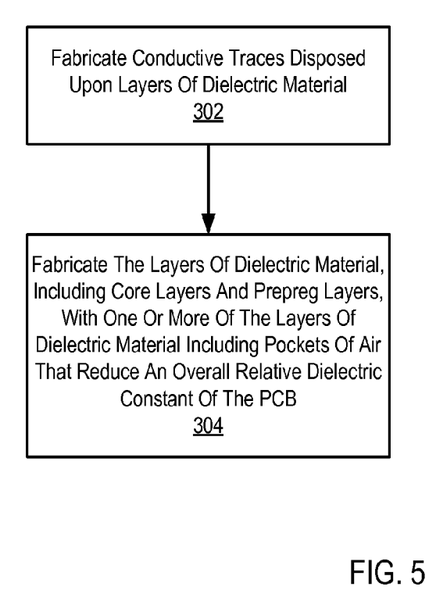
FIG. 5 sets forth a flow chart illustrating an example method of manufacturing a PCB with reduced dielectric loss according to embodiments of the present invention.
Figure 6:
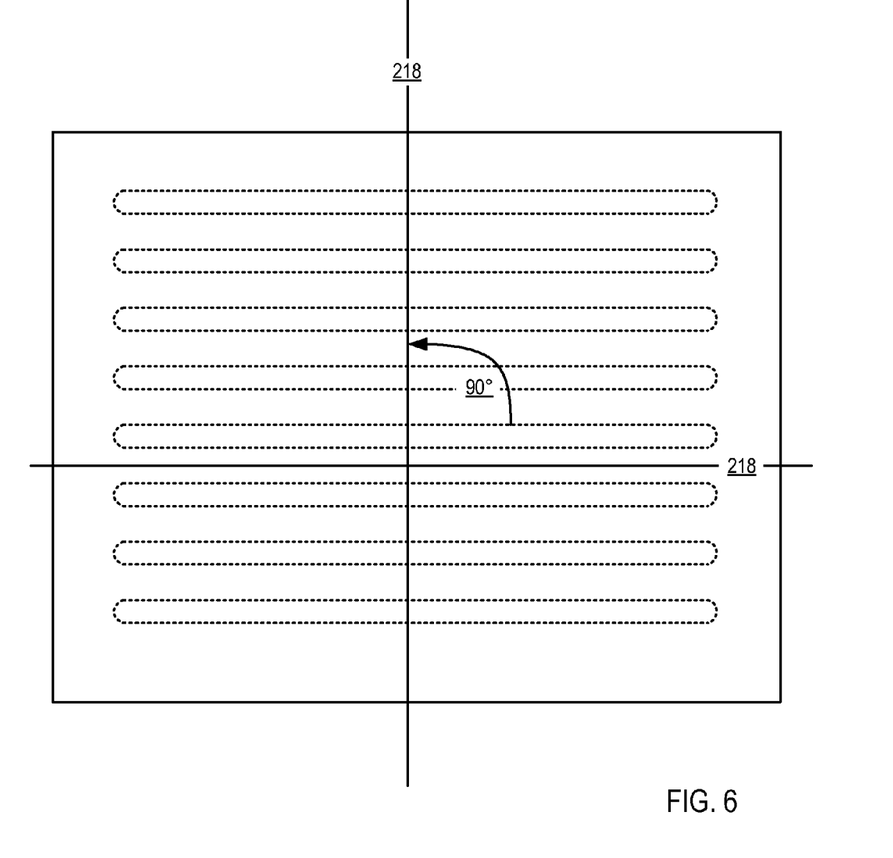
FIGS. 6-10 set forth line drawings of example PCBs with reduced dielectric loss according to embodiments of the present invention.
Figure 7:
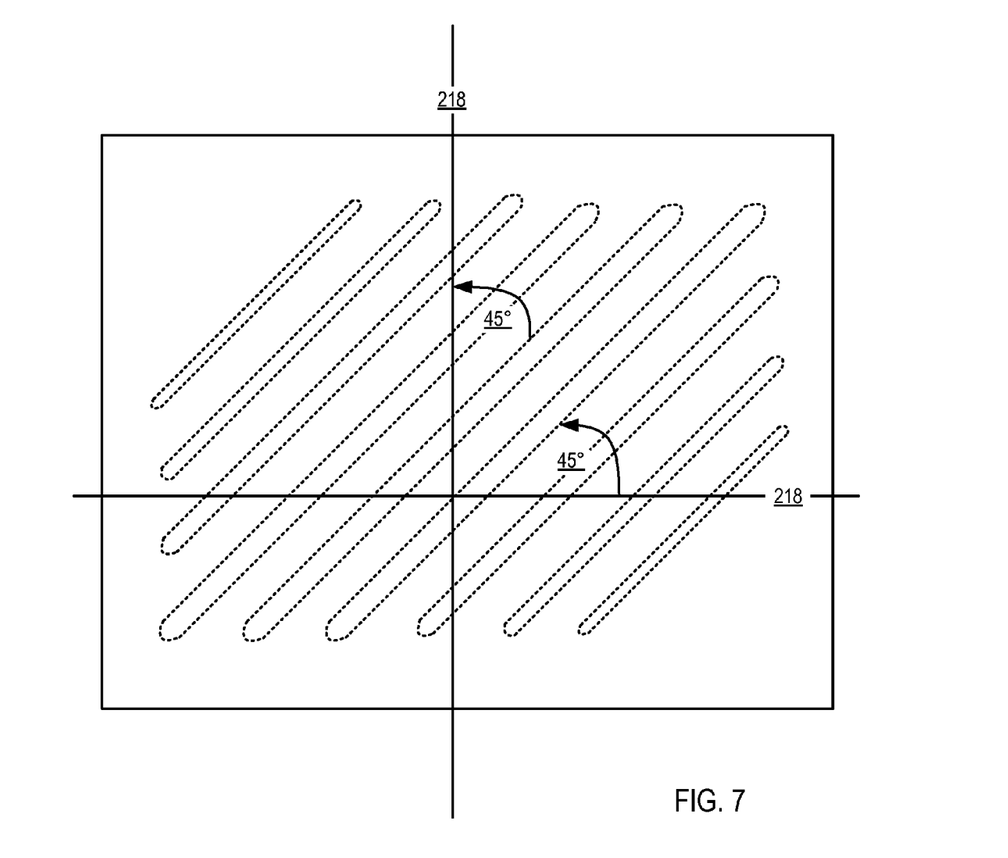
Figure 8:
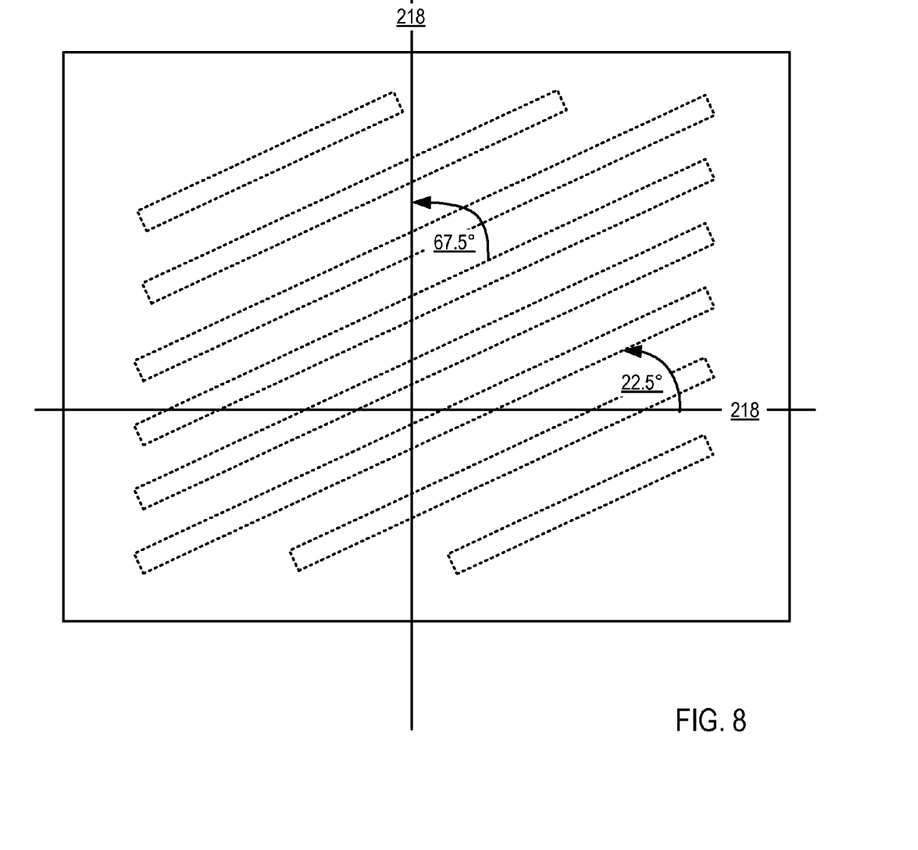
Figure 9:
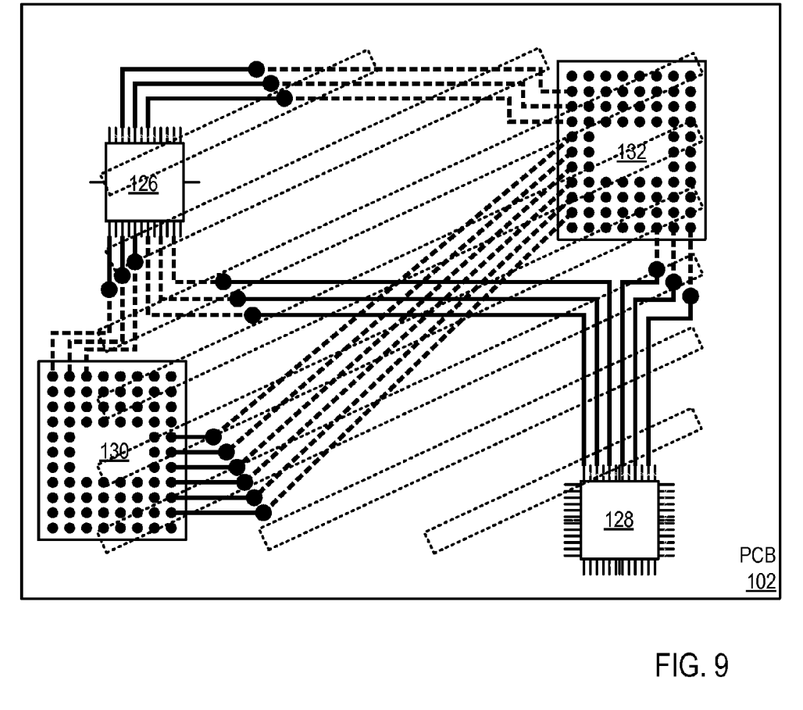
Figure 10:
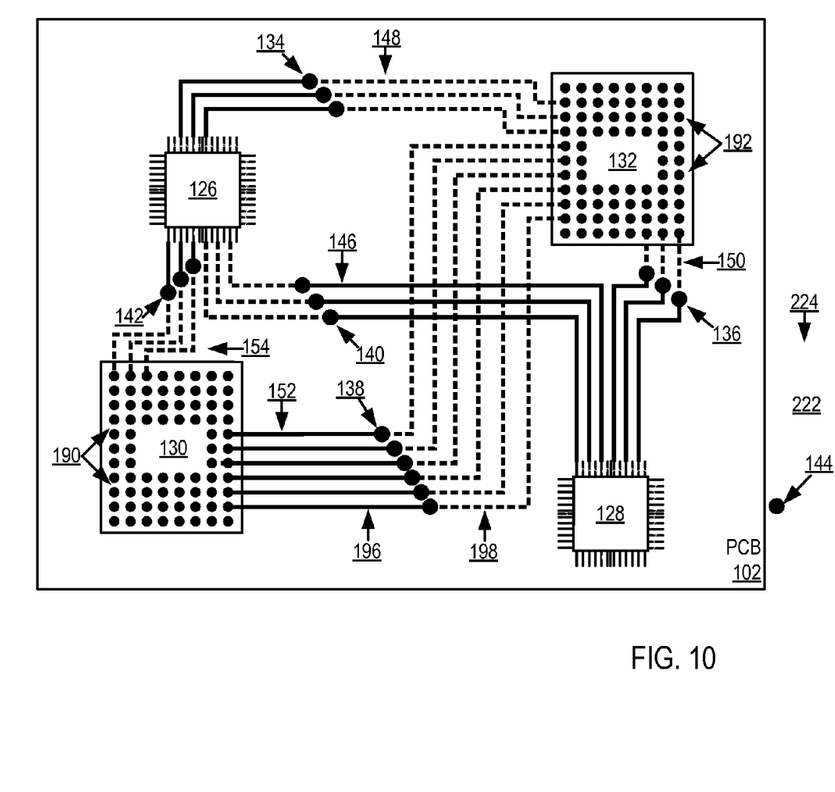

For further explanation, FIG. 5 sets forth a flow chart illustrating an example method of manufacturing a printed circuit board ('PCB') with reduced dielectric loss according to embodiments of the present invention. The method of FIG. 5 manufactures PCB like those described above with reference to FIGS. 1-4, and FIG. 5 is therefore described with reference to both FIG. 5 and also to FIGS. 1-4, using reference numbers from all five drawings. The method of FIG. 5 includes fabricating (302) conductive traces (202, 204, 206, 208) disposed upon layers of dielectric material. The conductive traces are etched from layers of copper foil bonded to core material (220) and to prepreg material (202, 208). Power planes may be etched from the same conductive layers. Signal traces and power planes on inner conductive layers (204, 206) are etched prior to stacking the layers of the PCB. The method of FIG. 5 also includes fabricating (304) the layers of dielectric material, including core layers and prepreg layers, with one or more of the layers of dielectric material including pockets of air that reduce an overall relative dielectric constant of the PCB. The pockets of air are formed in the dielectric material before the layers are stacked into a sandwich and cured in a heated press. After the entire PCB is cured in the heated press, signal traces and power planes are etched on the outer conductive layers (202, 208) bonded to outer layers of prepreg.

In some PCBs manufactured according to the method of FIG. 5, the pockets of air (104 on FIG. 2) are aligned with at least some of the conductive traces (196, 148). In some PCBs manufactured according to the method of FIG. 5, the conductive traces are disposed upon a layer of the dielectric material orthogonally with respect to one another (196, 150 on FIG. 3), and the pockets of air (104 on FIG. 3) are aligned at an angle of 45 degrees with respect to at least some of the conductive traces. In other PCBs manufactured according to the method of FIG. 5, some of the conductive traces are disposed upon layers of dielectric material orthogonally with respect to one another (146, 150 on FIG. 4), some of the conductive traces (198 on FIG. 4) are disposed upon layers of dielectric material at an angle of 45 degrees with respect to the orthogonal traces, and the pockets of air (104 on FIG. 4) are aligned at an angle of 22.5 degrees with respect to at least some of the orthogonal traces. In some PCBs manufactured according to the method of FIG. 5, the layers of dielectric material that include pockets of air are prepreg layers only (e.g., 226, 228 on FIG. 1). In other PCBs manufactured according to the method of FIG. 5, the layers of dielectric material that include pockets of air comprise both prepreg layers and core layers (e.g., 218, 226, 220, 228, 222 on FIG. 1).

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

The invention claimed is:

1. A printed circuit board ('PCB') with reduced dielectric loss, the PCB comprising:
   conductive traces disposed upon layers of dielectric material; and
   the layers of dielectric material, including core layers and prepreg layers, one or more of the layers of dielectric material including pockets of air that reduce an overall relative dielectric constant of the PCB, wherein:
   the conductive traces are disposed upon layers of the dielectric material orthogonally with respect to one another; and
   the pockets of air are aligned at an angle of 45 degrees with respect to the conductive traces.

2. The PCB of claim 1 wherein the pockets of air are aligned with at least some of the conductive traces.

3. The PCB of claim 1 wherein the layers of dielectric material that include pockets of air are prepreg layers only.

4. The PCB of claim 1 wherein the layers of dielectric material that include pockets of air comprise both prepreg layers and core layers.

5. A printed circuit board ('PCB') with reduced dielectric loss, the PCB comprising:
   conductive traces disposed upon layers of dielectric material; and
   the layers of dielectric material, including core layers and prepreg layers, one or more of the layers of dielectric material including pockets of air that reduce an overall relative dielectric constant of the PCB, wherein:
   at least some of the conductive traces are disposed upon layers of the dielectric material orthogonally with respect to one another;
   at least some of the conductive traces are disposed upon layers of the dielectric material at an angle of 45 degrees with respect to the orthogonal traces; and
   the pockets of air are aligned at an angle of 22.5 degrees with respect to at least some of the orthogonal traces.

6. The PCB of claim 5 wherein the pockets of air are aligned with at least some of the conductive traces.

7. The PCB of claim 5 wherein the layers of dielectric material that include pockets of air are prepreg layers only.

8. The PCB of claim 5 wherein the layers of dielectric material that include pockets of air comprise both prepreg layers and core layers.

* * * * *